(12) United States Patent
Momeni et al.

(10) Patent No.: US 9,515,639 B2
(45) Date of Patent: Dec. 6, 2016

(54) METHOD FOR GENERATING A PULSE AND CIRCUIT CONFIGURATION FOR AN ELECTRONIC DEVICE TO GENERATE A PULSE

(71) Applicant: Robert Bosch GmbH, Stuttgart (DE)

(72) Inventors: Massoud Momeni, Filderstadt (DE); Matthias Siemss, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/569,695

(22) Filed: Dec. 13, 2014

(65) Prior Publication Data

US 2015/0171845 A1 Jun. 18, 2015

(30) Foreign Application Priority Data

Dec. 17, 2013 (DE) .......................... 10 2013 226 300

(51) Int. Cl.
*H03K 3/017* (2006.01)
*H03K 5/04* (2006.01)
*H03K 7/08* (2006.01)
*H03K 5/08* (2006.01)
*H04L 25/02* (2006.01)
*H04L 25/03* (2006.01)

(52) U.S. Cl.
CPC ............. *H03K 5/08* (2013.01); *H04L 25/0286* (2013.01); *H04L 25/0384* (2013.01)

(58) Field of Classification Search
USPC .......................... 327/165, 166, 170, 172, 176
See application file for complete search history.

(56) References Cited

U.S. PATENT DOCUMENTS

| | | | | | |
|---|---|---|---|---|---|
| 6,313,777 | B1* | 11/2001 | Horvat | ...................... | G06F 1/03 341/144 |
| 6,484,223 | B1* | 11/2002 | Lenz | .................. | H04L 25/03834 327/50 |
| 7,830,278 | B2* | 11/2010 | Lohberg | .................. | G01D 5/145 341/11 |
| 8,144,740 | B1* | 3/2012 | Brown | ................ | G03F 7/70025 372/32 |
| 8,176,351 | B2* | 5/2012 | Castro | .............. | G01R 31/31712 327/156 |
| 2008/0165337 | A1* | 7/2008 | Ershov | ................ | G03F 7/70025 355/67 |
| 2013/0222034 | A1 | 8/2013 | Frei | | |

FOREIGN PATENT DOCUMENTS

| | | |
|---|---|---|
| DE | 28 21 023 A1 | 11/1979 |
| GB | 2 360 680 A | 9/2001 |
| WO | 2013/117415 A1 | 8/2013 |

* cited by examiner

*Primary Examiner* — Brandon S Cole
(74) *Attorney, Agent, or Firm* — Maginot, Moore & Beck LLP (57) ABSTRACT

A method for generating a pulse, wherein a predetermined first limit curve and a predetermined second limit curve are defined for a pulse shape of the pulse, wherein the limit curves describe the change over time of a current variable, and wherein the second limit curve runs entirely within the first limit curve. As a pulse shape for the pulse, a curve plotted between the limit curves is generated, which, in comparison with a rectangular pulse plotted between the limit curves, in a first area of the current variable facing away from an extremum, is deformed toward the first limit curve and which, in a second area of the current variable facing toward the extremum, is deformed toward the second limit curve.

10 Claims, 3 Drawing Sheets

METHOD FOR GENERATING A PULSE AND CIRCUIT CONFIGURATION FOR AN ELECTRONIC DEVICE TO GENERATE A PULSE

This application claims priority under 35 U.S.C. §119 to patent application no. DE 10 2013 226 300.7, filed on Dec. 17, 2013 in Germany, the disclosure of which is incorporated herein by reference in its entirety.

The disclosure relates to a method and a circuit for generating a pulse for a data transmission.

BACKGROUND

Methods and circuit configurations of the type referred to here are known. A predetermined, first limit curve and a predetermined, second limit curve are defined for a pulse shape of a pulse to be generated, wherein the limit curves describe the change over time of a current variable, for example a current or voltage, and wherein the second limit curve runs entirely within the first limit curve. The limit curves thus form envelopes which define specification limits for the pulse to be generated. In a known manner, rectangular pulses, which are also referred to as square-wave pulses, are generated for the data transmission. These are plotted, typically maintaining a specific safety distance from the specification limits, between the limit curves, wherein the steepest possible edges are sought for a change in the current variable from a quiescent level to a data level and back. Transitions between the quiescent level and the edges on the one hand and the data level and the edges on the other hand are preferably defined to be as sharp as possible, i.e. are designed to be as rectangular as possible. Pulses are to be generated in this way which are as defined as possible and can be acquired without errors.

It is disadvantageous here that rectangular pulses of this type have a high harmonic component and therefore result in an increased electromagnetic radiation in the data transmission. The object of the disclosure is therefore to produce a method and a circuit configuration which, in particular, avoid this disadvantage.

SUMMARY

According to an exemplary embodiment of the disclosure, the method is characterized in that a curve plotted between the limit curves which, in comparison with a rectangular pulse plotted between the limit curves, in a first area of the current variable facing away from an extremum of the curve, is deformed toward the first limit curve, is generated as the pulse shape for the pulse, wherein the curve, in a second area of the current variable facing away from the extremum, is deformed toward the second limit curve. In this way, the specification limits are better utilized in order to generate less steep edges and/or less sharp corners compared with the conventional rectangular pulse. It is evident here that the curve which describes the pulse shape of the pulse runs less steeply in the area of the edges if, starting from a rectangular standard pulse in an area facing away from the extremum, it is deformed toward the first limit curve, i.e. outwardly, whereas, in the second area facing toward the extremum, it is deformed toward the second limit curve, i.e. inwardly. This therefore results in a smaller harmonic component than in the rectangular pulse, so that the electromagnetic radiation is also reduced. At the same time, the defined specification limits are maintained, so that the pulse can still be readily recognized, in particular can be acquired and detected unambiguously as such.

The first area of the current variable facing away from the extremum preferably extends from the quiescent level up to at most 50% of the signal excursion, i.e. the difference between the extremal value and the quiescent level, particularly preferably from the quiescent level up to at most 30% of the signal excursion. The second area of the current variable facing toward the extremum preferably follows directly on from the first area, wherein it extends preferably from at least 50% of the signal excursion up to the extremal value, wherein it extends particularly preferably from at least 30% of the signal excursion up to the extremal value. The extremal value is preferably identical to the data level.

It is possible for a positive pulse to be generated, wherein the quiescent level corresponds to a low level of the current variable (low-level), whereas the data level corresponds to a higher level of the current variable (high-level). A switchover from the low quiescent level to the higher data level and back again therefore takes place in the characteristic of the pulse.

Alternatively, it is possible for the pulse to be generated as a negative pulse, wherein the quiescent level has a higher level of the current variable (high-level), wherein the data level corresponds to a lower value of the current variable (low-level). A switchover from the higher quiescent level to the lower data level and back then takes place in the characteristic of the pulse shape.

In the case of a positive pulse, a maximum of the curve describing the pulse shape is addressed with the extremum. In the case of a negative pulse, a minimum of the curve describing the pulse shape is addressed with the extremum.

The first limit curve and the second limit curve are obtained from predetermined specifications for the pulse shape, wherein, in particular, both the maxima and the minima for a rise and fall time of the pulse in the area of the edges, a duty cycle, and a signal excursion (difference in the current variable between the data level and the quiescent level) are predefined. The first limit curve is then obtained for a positive pulse, preferably using the maximum specification values, and for a negative pulse, preferably using the minimum specification values. The second limit curve, which lies entirely within the first limit curve, is obtained accordingly for a positive pulse, preferably using the minimum specification values, and for a negative pulse, preferably using the maximum specification values.

A voltage or current is preferably used as the current variable, and the pulse is preferably generated accordingly as a voltage pulse or as a current pulse.

The method is preferably used to transmit sensor data to a central control device, in particular of a motor vehicle. Current interfaces are typically used here, in particular for peripheral sensors of occupant protection systems. A bus operation is preferably implemented by means of synchronization, wherein a plurality of sensors are connected via a data bus to a receiver. A working clock in the form of voltage pulses is generated for the synchronization function, said pulses being detected by the sensors connected to the bus and characterizing the start of a new cycle for the data transmission. The voltage pulses are also referred to as synchronization pulses. The data transmission from the sensors to the receiver takes place in the form of current pulses which are designed in known systems as rectangular pulses.

Within the framework of the method proposed here, current pulses are then preferably generated for the data transmission from the sensor to the receiver, i.e. the central control device, the pulse shape of said pulses deviating in the manner described from the shape of a rectangular pulse. Additionally or alternatively, it is possible to use a corresponding pulse shape for the synchronization pulse also.

An embodiment of the method is preferred which is characterized in that a pulse is generated with a pulse shape which has edges which run as flat as possible within the limit curves. The rise or fall is preferably designed by fully exploiting the specification limits at the lowest possible rate, i.e. as slowly as possible. In this way, in contrast to the customary effort to design edges of a rectangular pulse to be as steep as possible, a slowest possible rise and slowest possible fall of the pulse is effected here in order to minimize the harmonic component and therefore the electromagnetic radiation. The specification limits are maintained here in order to guarantee an unambiguous recognition of the pulse.

An embodiment of the method is also preferred which is characterized in that an essentially rectangular pulse with rounded corners is created. In this case, the edges of the pulse are only slightly or not at all modified, wherein, however, roundings are produced in the corners, i.e. the transition areas between the quiescent level and the edges or between the data level and the edges. The harmonic component is significantly reduced here and the electromagnetic radiation is lessened. In particular, non-differentiable areas of the pulse shape are avoided in this manner. The pulse is generated in such a way that a radius of the curve in the area of the corners is greater than in a standard rectangular pulse.

A maximum possible radius in the area of the corners, i.e. the transitions between the edges and the quiescent level or the edges and the data level, is preferably sought by fully exploiting the specification limits in order to minimize the harmonic component and the electromagnetic radiation.

An embodiment of the method is also preferred which is characterized in that a step shape with a predetermined number of steps is produced in the area of the edges of the pulse. In particular, a step-shaped rise or fall with a predetermined resolution is produced, in particular with a resolution of N bits, where N is a predetermined natural number. This represents a particularly favorable and technically simple-to-implement type of generation of the pulse, wherein, due to the step shape, a delayed or flatter characteristic of the edges is effected in comparison with the standard rectangular shape, as a result of which the harmonic component of the pulse is reduced and the electromagnetic radiation is lessened. It is evident here that, the higher the predetermined number of steps, i.e. the resolution for the step-shaped edges, in particular the greater the number N is, the more this is the case.

An embodiment of the method is also preferred which is characterized in that a curve which has a non-zero curvature everywhere except at most for the area of an extremal value of the pulse is produced as a pulse shape. The value corresponding to the data level is addressed with the extremal value, which former value, irrespective of whether a positive or negative pulse is involved, can be designed as a minimum or as a maximum. A curve which has a non-zero curvature everywhere except for the area of the extremal value is obtained in particular as a limit case of a pulse with step-shaped edges, if the predetermined number of steps for the step shape or the resolution or the value of the number N tends toward infinity. It is also possible for a continuous curve to be produced for the pulse with a non-zero curvature by a circuit configuration which is provided for the pulse generation, if the circuit configuration is controlled with a step shape with a predetermined finite number of steps. In particular, inductors and/or capacitors provided in the circuit configuration can contribute to a rounding of the curve that is actually step-shaped by control, so that finally a quasi-continuous or continuous curve shape results, the curvature of which is non-zero everywhere except at most for the extremal value. As a result of the curvature of the curve diminishing everywhere except at most for the extremal value and naturally the area of the quiescent level which, however, in this respect is not included in the consideration of the pulse shape, the harmonic component of the pulse and also the electromagnetic radiation are minimized.

A method is particularly preferred which is characterized in that a current curve is produced for the pulse. Consequently, a current strength is used as the current variable, so that a current pulse, as opposed to a voltage pulse, is generated. This design of the method is particularly favorable for use with sensors which communicate with a central control device via a current interface.

An embodiment of the method is also preferred which is characterized in that the pulse shape of the pulse is optimized for a minimum electromagnetic radiation. In particular, it is possible to minimize the harmonic component and the electromagnetic radiation in this manner.

According to another exemplary embodiment of the disclosure, the object is also achieved by producing a circuit configured for use in an electronic device and for generating a pulse for a data transmission between the electronic device and a receiving device. The circuit configuration is preferably configured to carry out a method according to one of the previously described embodiments. The circuit configuration has a line section which carries a supply voltage, wherein the line section is simultaneously provided for the data transmission. The line section has an operative electrical connection to a data generation means. Here, this operative connection serves, in particular, to supply the data generation means with electrical power. The circuit configuration is characterized by a pulse shape generation means which is operatively connected to the data generation means so that data are transmittable from the data generation means to the pulse shape generation means. The pulse shape generation means is operatively connected to the line section and is configured to impress a pulse shape on the line section. A predetermined, first limit curve and a predetermined, second limit curve are defined for the pulse shape, wherein the limit curves describe the change over time of a current variable, and wherein the second limit curve runs entirely within the first limit curve. The pulse shape generation means is designed to generate a pulse on the line section with a pulse shape which is plotted between the limit curves, wherein, in comparison with a rectangular pulse plotted between the limit curves, the pulse shape, in a first area of the current variable facing away from an extremum is deformed toward the first limit curve, and, in a second area of the current variable facing toward the extremum, is deformed toward the second curve. In relation to the definitions of terms and explanations, reference is made to the descriptions in connection with the method. In connection with the circuit configuration, the advantages that have already been explained in connection with the method are gained.

A circuit configuration is preferred which is characterized in that the pulse shape generation means is configured to generate step-shaped pulse edges with a predetermined resolution. The step-shaped pulse edges preferably have a resolution of N bits, wherein N is a predetermined natural number. A harmonic component and an electromagnetic radiation of the pulse are minimized due to the step-shaped design of the pulse edges. At the same time, a particularly simply designed and economical pulse shape generation means can be used to readily generate step-shaped pulse edges of this type.

A circuit configuration is also preferred which is characterized in that a current sink is electrically connected to the line section in parallel with the data generation means, wherein the pulse shape generation means is operatively connected to the current sink. The pulse shape generation means has a digital controller operatively connected to the data generation means and a digital/analog converter operatively connected to the digital controller. The digital/analog converter is configured to influence a current in the current sink according to specifications or depending on the digital controller. For this purpose, the digital/analog converter preferably has a direct operative connection to the current sink. The digital controller receives the data to be transmitted from the data generation means and from said data generates a signal which is forwarded to the digital/analog converter. The latter converts the signal into a signal suitable for controlling the current sink and in turn controls the current sink with said signal. Since the current sink is electrically connected to the line section, the current in the line section is modulated in this way so that current pulses can finally be generated on the line section for the data transmission by the pulse shape generation means. In particular, the digital controller is configured to generate a signal which is suitable for generating a pulse shape according to the disclosure.

In a preferred embodiment of the method, the digital controller generates a signal with a resolution of N bits which is used via the digital/analog converter to control the current sink.

An example embodiment of the circuit configuration is preferred which is characterized in that a serial arrangement consisting of a transistor and a resistor is electrically connected to the line section in parallel with the data transmission means. The transistor has a control connection, a first transistor connection and a second transistor connection, wherein it is electrically connected with the first transistor connection to the line section. The resistor is electrically connected on a first end to the second transistor connection and on a second end to ground. The circuit configuration has an amplifier which has a first amplifier input, a second amplifier input and an amplifier output, wherein the amplifier output is electrically connected to the control connection of the transistor. The second amplifier input is electrically connected to the first end of the resistor. The first amplifier input is electrically connected to a reference voltage source. The pulse shape generation means is operatively connected to the reference voltage source, wherein it has a digital controller operatively connected to the data generation means and a digital/analog converter operatively connected to the digital controller. The digital/analog converter is configured to influence a voltage of the reference voltage source according to specifications or depending on the digital controller. In particular, the digital controller is configured to generate a signal which is suitable for generating a pulse shape according to the disclosure.

The transistor is preferably designed as a field effect transistor, wherein the control connection is designed as a gate, the first transistor connection as a source, and the second transistor connection as a drain, or vice versa.

The amplifier is preferably designed as an operational amplifier, in particular as a comparator, wherein the first amplifier input is preferably designed as a non-inverting input, wherein the second amplifier input is designed as an inverting input, or vice versa.

The digital controller is preferably designed to generate a signal with a resolution of N bits, wherein the reference voltage source is controlled by the signal conveyed via the digital/analog converter in such a way that the transistor is switched via the amplifier so that a current is influenced in the line section in such a way that current pulses of the type mentioned here can be generated for the data transmission.

The electronic device is preferably designed as a sensor which is configured to communicate with a central control device via a current interface.

The line section is preferably connected to a data bus or represents a section of a data bus, wherein both a supply voltage for the electronic device and a data transfer take place via the data bus.

The subject-matter of the disclosure also includes an electronic device which has the circuit configuration described above. The electronic device is preferably designed as a sensor, in particular as a sensor which is configured to communicate with a central control device via a current interface.

The electronic device is particularly preferably a sensor which is used in a motor vehicle in connection with an occupant protection system.

The description of the method on the one hand and the description of the circuit configuration and the electronic device on the other hand are to be understood as complementary to one another. In particular, features of the circuit configuration and the electronic device which have been implicitly or explicitly explained in connection with the method, individually or combined with one another, are preferably features of a preferred embodiment of the circuit configuration or the electronic device. In particular, a circuit configuration or an electronic device is preferred which has at least one feature which is determined by a step of the method. Method steps which have been implicitly or explicitly described in connection with the circuit configuration or with the electronic device, individually or combined with one another, are preferably steps of a preferred embodiment of the method. In particular, a method is preferred which has at least one method step which is determined by at least one feature of the circuit configuration or the electronic device.

BRIEF DESCRIPTION OF THE DRAWINGS

The disclosure is explained in detail below with reference to the drawing, in which.

DETAILED DESCRIPTION

Figure 1:
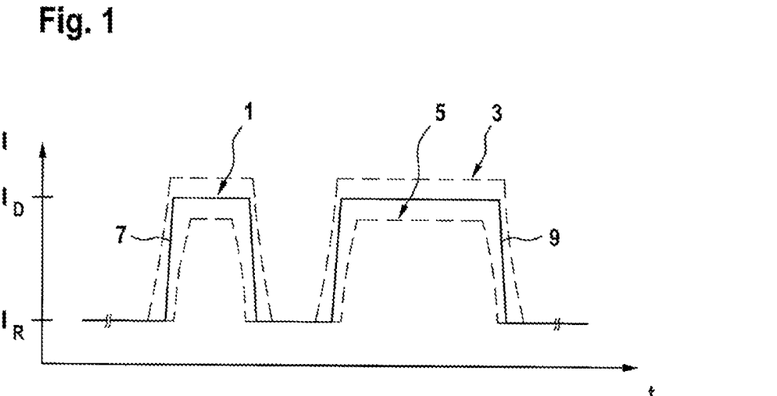
FIG. 1 shows a diagrammatic representation of conventional rectangular pulses.

FIG. 1 shows a diagrammatic plotting of a current variable, here the current strength I against time t. A first limit curve 3 and a second limit curve 5 are drawn in the diagram, wherein the characteristic of the limit curves 3, 5 is obtained from predetermined specification limits for the pulses to be generated, in particular from specification limits for a signal excursion, and rise and fall times for the pulse edges, and for a duty cycle. The second limit curve 5 is disposed entirely within the first limit curve 3 and thus, in a manner of speaking, defines the minimum values for the pulses to be generated. The first limit curve 3 is disposed entirely outside the second limit curve 5 and, in a manner of speaking, defines the maximum values for the parameters of the pulses to be generated. A signal curve 1, which has a first pulse 7 and a second pulse 9, is plotted in the limit curves 3, 5, wherein the second pulse 9 is longer than the first pulse 7, in particular has a longer data level phase or high phase. The signal curve 1 changes in the characteristic of the pulses 7, 9 from a quiescent level $I_R$ to a data level $I_D$ of the current strength I. The signal curve 1 always remains within the limit curves 3, 5 in the area of the pulses 7, 9, as a result of which it is ensured that the pulses 7, 9 can be unambiguously recognized as such.

It is clearly recognizable from FIG. 1 that, in the conventional rectangular pulses 7, 9, a steep rise or fall of the pulse edges which extend from the quiescent level $I_R$ to the data level $I_D$ and vice versa is achieved, wherein sharp corners are simultaneously produced in the transition areas between the quiescent level $I_R$ and the edges and between the data level $I_D$ and the edges. A Fourier transform of the signal curve 1 therefore has a high harmonic component, as a result of which an electromagnetic radiation is also high during the data transmission by means of the signal curve 1.

Figure 2:
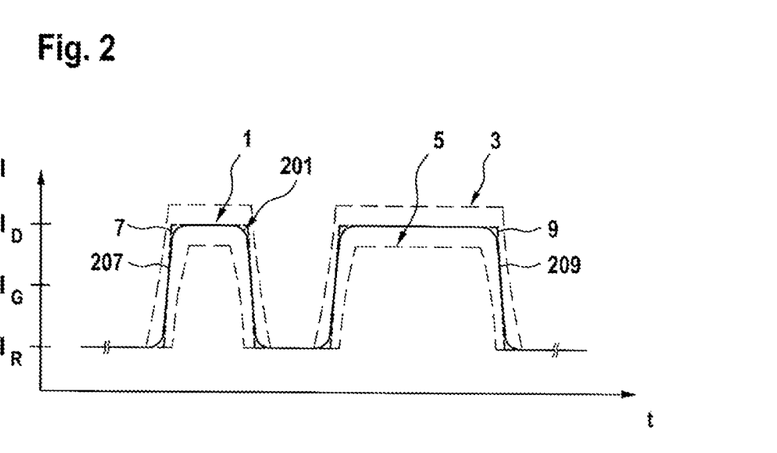
FIG. 2 shows a diagrammatic representation of pulses which are generated according to a first embodiment of the method.

FIG. 2 shows a diagrammatic representation of two pulses 207, 209 of a signal curve 201 which are generated according to a first embodiment of the method. Identical and functionally identical elements are denoted with the same reference numbers, so that reference is made in this respect to the preceding description. The first limit curve 3 and the second limit curve 5 are similarly drawn, and also, as a broken line for comparison, the signal curve 1 shown in FIG. 1 with the rectangular pulses 7, 9. It is evident that the pulses 207, 209 have a pulse shape here which, in comparison with the rectangular pulses 7, 9 in a first area facing away from the pulse maximum in the data level $I_D$, are deformed toward the first limit curve 3, wherein, in a second area facing toward the maximum, they are deformed toward the second limit curve 5. The signal curve 1 therefore deviates from the rectangular shape in the first area in the direction toward the first limit curve 3, wherein it deviates in the second area from the rectangular shape in the direction of the second limit curve 5. This behavior relates here to the edges of the pulses 207, 209. The first area and the second area of the current strength I are adjacent to one another here with a limit current strength $I_G$, the value of which is approximately 50% of the difference between the value of the data level $I_D$ and therefore the maximum of the pulses 207, 209 and the quiescent level $I_R$. The first area thus extends from the quiescent level $I_R$ up to the limit current strength $I_G$; the second area extends from the limit current strength $I_G$ up to the data level $I_D$. By means of a comparison of the pulse edges of the pulses 207, 209 with the pulse edges of the pulses 7, 9, it is immediately evident that the edges of the pulses 207, 209 deviate from the edges of the rectangular pulses 7 9 in the lower, first area in the direction of the first limit curve 3, wherein they deviate in the upper, second area toward the second limit curve 5.

It is furthermore evident that the pulses 207, 209 are designed as essentially rectangular, wherein, however, they have rounded corners in the transition areas between the quiescent level $I_R$ and the pulse edges and between the data level $I_D$ and the pulse edges. The radius of the signal curve 201 is greater in the area of the corners than in the signal curve 1.

Due to the rounding of the corners of the signal curve 201, their harmonic component, and therefore simultaneously the electromagnetic radiation also, decrease during the data transmission.

Figure 3:
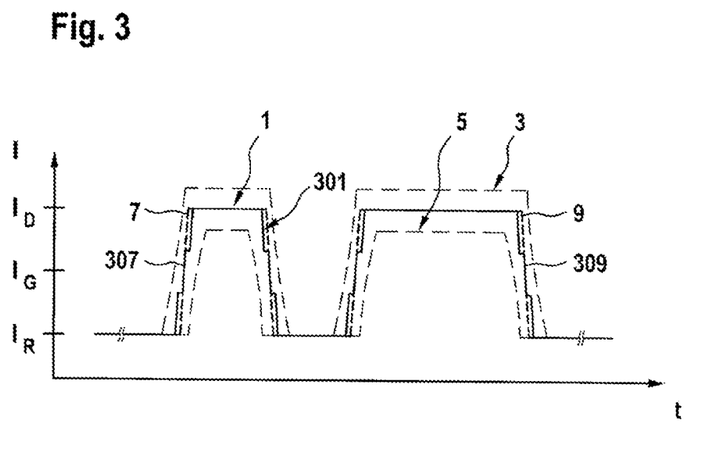
FIG. 3 shows a diagrammatic representation of pulses which are generated according to a second embodiment of the method.

FIG. 3 shows a diagrammatic representation of pulses 307, 309 of a signal curve 301 which are generated according to a second embodiment of the method. Identical and functionally identical elements are otherwise denoted with the same reference numbers, so that reference is made to the preceding description. Here, the pulses 307, 309 have pulse edges which have a step shape with a predetermined number of steps. In the example embodiment shown, the edges have three steps in total.

The step shape of the pulse edges of the pulses 307, 309 is preferably created with a resolution of N bits, wherein N is a predetermined, natural number.

Here also, it is evident that the step-shaped pulse edges, in the first lower area up to the limit current strength $I_G$, here again deviate at approximately 50% of the data level $I_D$—calculated from the quiescent level $I_R$—from the pulse edges of the pulses 7, 9 of the signal curve 1 drawn as a broken line for comparison, toward the first limit curve 3, wherein, above the limit current strength $I_G$ in the second area, they deviate toward the second limit curve 5. On the whole, a slower rise or fall of the pulse edges is thus effected, as a result of which the harmonic component of the signal curve 301 and the electromagnetic radiation decrease during the data transmission.

Figure 4:
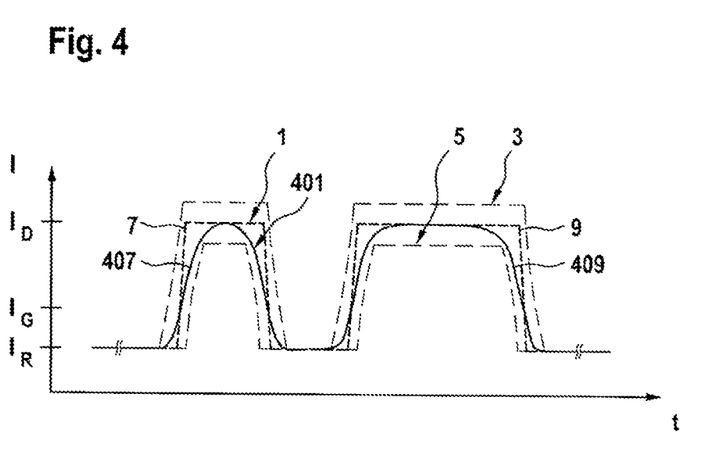
FIG. 4 shows a diagrammatic representation of pulses which are generated according to a third embodiment of the method.

FIG. 4 shows a diagrammatic representation of pulses 407, 409 of a signal curve 401. The signal curve 1 with the rectangular pulses 7, 9 is again drawn for comparison. Identical and functionally identical elements are otherwise denoted with the same reference numbers, so that reference is made to the preceding description. Here, the pulse shape of the pulses 407, 409 or the curve which describes the pulse shape of these pulses has a non-zero curvature everywhere in the area of the pulses 407, 409 except for the area of the maximum value of the longer pulse 409 in the data level $I_D$. The pulse shapes of the pulses 407, 409 are particularly preferably optimized for a minimum electromagnetic radiation.

The specification limits in the form of the limit curves 3, 5 are exploited here as fully as possible, preferably taking into account a certain safety distance, in order to design a signal curve 401 which is as smooth as possible with flatly rising pulse edges and the greatest possible radii, while avoiding sharp corners. The harmonic component and the electromagnetic radiation for the signal curve 401 are minimized in this manner.

Here, the limit current strength $I_G$, at approximately 30% of the data level $I_D$, calculated from the quiescent level $I_R$, is consequently the extremal or maximum value of the pulses 407, 409.

The pulse shapes of the pulses 407, 409 shown in FIG. 4 are preferably obtained as the limit case of the pulse shapes of the pulses 307, 309 according to FIG. 3 for an infinite number of steps in the area of the edges or an infinitely large resolution of the pulse edges, i.e. if the number N tends toward infinity.

In reality, the signal curve 401 shown in FIG. 4 is already obtained with a control of a suitable circuit configuration with a finite resolution because, in particular, inductors and/or capacitors comprised by the circuit configuration produce a rounding of the curve shape. In a real circuit configuration, a step-shaped control for generating the pulse edges therefore results in the signal shape 401 shown in FIG. 4, if the resolution is sufficiently high.

The signal curve 401 with the pulses 407, 409 according to FIG. 4 is particularly advantageous, not only because rounded corners and/or slowly rising, in particular step-shaped, edges are provided, but also because the overall shape of the pulses 407, 409 is optimized for a reduced harmonic component and a reduced electromagnetic radiation, in particular with rounding of the overall pulses 407, 409.

It is also evident that all pulse shapes shown here according to FIGS. 2 to 4 always remain within the specification limits, i.e. within the first limit curve 3 and the second limit curve 5 so that the pulses, despite their pulse shape deviating from the standard rectangular shape of the pulses 7, 9, are readily detected by a receiver device and are correctly recognized as pulses.

Figure 5:
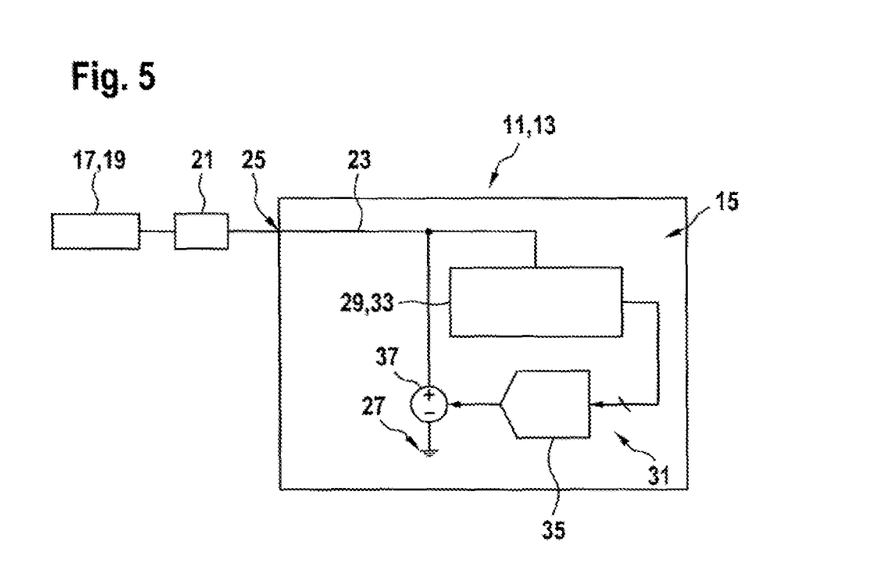
FIG. 5 shows a schematic representation of a first example embodiment of a circuit configuration.

FIG. 5 shows a first example embodiment of an electronic device 11 which is designed here as a sensor 13, in particular as a peripheral sensor for an occupant protection system of a motor vehicle. The electronic device 11 has a circuit configuration 15 which is configured to generate a pulse for a data transmission between the electronic device 11 and a receiving device 17 which is designed here as a central control device 19 of a motor vehicle. The electronic device 11 is connected to the receiving device 17 via a data bus 21 for the data transmission.

The circuit configuration 15 has a line section 23 which carries a supply voltage. For this purpose, in the example embodiment shown, the line section 23 is connected to the data bus 21, wherein the data bus 21, and therefore also the line section 23, are provided for both the data transmission between the electronic device 11 and the receiving device 17 and for the supply of the electronic device 11 with electrical power. A current interface, which is denoted here schematically by the reference number 25, is thus implemented for the data transmission.

The electronic device 11 and also the circuit configuration 15 preferably have only two connections, i.e. the supply connection implemented via the line section 23, which serves simultaneously for the data transmission, and a ground connection 27, shown here only symbolically.

The line section 23 has an electrical operative connection to a data generation means 29 (also referred to herein as a data generation device), wherein said means may be designed, for example, as a sensor circuit which performs all tasks of the sensor 13 except for the data transmission, wherein it is possible for the data transmission to be designed as at least partially integrated into the data generation means 29 also.

A pulse shape generation means 31 (also referred to herein as a pulse generation device) is furthermore provided which, on the one hand, is operatively connected to the data generation means 29 in such a way that data are transmittable from the data generation means 29 to the pulse shape generation means 31, wherein, on the other hand, it is operatively connected to the line section 23 in order to impress on the latter a signal curve 1 which comprises the data to be transmitted as a sequence of pulses.

The pulse shape generation means 31 is designed here so that at least one of the pulse shapes shown in FIGS. 2 to 4 can be generated by means of the pulse shape generation means 31.

In the example embodiment shown in FIG. 5, the pulse shape generation means 31 has a digital controller 33, integrated here into the data generation means 29, and a digital/analog converter 35 operatively connected to the digital controller 33. Furthermore, the pulse shape generation means 31 has a current sink 37 which is electrically connected to the line section 23. The digital/analog converter 35 is controlled by the digital controller 33 with a predetermined resolution, wherein it acts on the current sink 37 in such a way that the latter modifies the current characteristic in the line section 23 in such a way that a current curve is impressed on the line section 23 with pulses which have an improved shape in terms of an electromagnetic radiation, in particular one of the pulse shapes shown in FIGS. 2 to 4, wherein the current curve, as a signal curve, represents the data generated by the data generation means 29 and to be transmitted to the receiving device 17.

The digital controller 33 is particularly preferably configured to generate a pulse shape with step-shaped edges with a predetermined resolution, in particular of N bits, wherein N is a predetermined, natural number.

Figure 6:
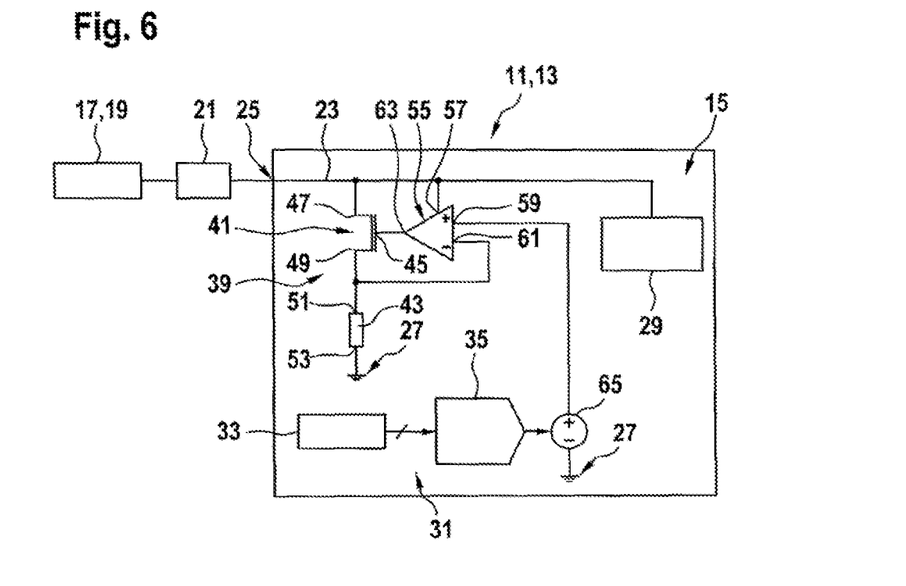
FIG. 6 shows a schematic representation of a second example embodiment of the circuit configuration.

FIG. 6 shows a second example embodiment of an electronic device 11 and a circuit configuration 15. Identical and functionally identical elements are denoted with the same reference numbers, so that reference is made in this respect to the preceding description. In the example embodiment shown here, a serial arrangement 39, which has a transistor 41 and a resistor 43, is connected to the line section 23 in parallel with the data generation means 29, which is in turn preferably designed as the remaining sensor circuit of the electronic device 11 designed as the sensor 13.

The transistor has a control connection 45, a first transistor connection 47 and a second transistor connection 49. In the example embodiment shown in FIG. 6, the transistor 41 is designed as a field effect transistor, wherein the control connection 45 is a gate connection, and wherein the first transistor connection 47 is preferably a source connection, and the second transistor connection 49 is a drain connection. Alternatively, it is also possible for the first transistor connection 47 to be a drain connection, wherein the second transistor connection 49 is a source connection.

Alternatively, it is also possible for the transistor 41 to be designed as a bipolar transistor, wherein, in this case, the control connection 45 is designed as a base. The transistor connections 47, 49 are designed correspondingly as a collector and emitter, wherein this allocation may vary according to the specific example embodiment.

The resistor 43 has a first end 51 and a second end 53.

The transistor 41 is electrically connected with the first transistor connection 47 to the line section 23, wherein it is electrically connected with the second transistor connection 49 to the first end 51 of the resistor 43. The second end 53 of the resistor 43 is electrically connected to ground.

The circuit configuration 15 furthermore has an amplifier 55 which, in the example embodiment shown, is designed as an operational amplifier. The amplifier 55 has a supply input 57, a first amplifier input 59, a second amplifier input 61 and an amplifier output 63. The first amplifier input 59 is preferably designed as a non-inverting input of the operational amplifier, wherein the second amplifier input 61 is designed as an inverting input. However, a reverse assignment is also possible, depending on the specific example embodiment.

The supply input 57 is electrically connected to the line section 23 to supply the amplifier 55 with electrical power. The amplifier output 63 is electrically connected to the control connection 45 of the transistor 41. The second amplifier input 61 is electrically connected to the first end 51 of the resistor 43 and thus simultaneously to the second transistor connection 49 also. In particular, the second amplifier input 61 is electrically connected here to a conductor section which electrically connects the second transistor connection 49 to the first end 51 of the resistor 43.

The first amplifier input 59 is electrically connected to a reference voltage source 65, wherein the latter is operatively connected to the digital/analog converter 35 so that it is controllable via the digital control 33 and the digital/analog converter 35.

In this respect, the pulse shape generation means 31 is thus operatively connected here to the reference voltage source 65. Although not shown in FIG. 6, an operative connection nevertheless exists between the data generation means 29 and the digital controller 33, via which data are transmittable from the data generation means 29 to the digital controller 33. In a manner already explained in connection with FIG. 5, the digital controller 33 controls the digital/analog converter 35 with a predetermined resolution, wherein the latter acts on the reference voltage source 65 depending on the specification of the digital controller 33 and thus influences the voltage present on the first amplifier input 59. The amplifier 55 controls the control connection 45 of the transistor 41 depending on a voltage difference between the first amplifier input 59 and the second amplifier input 61, as a result of which a current flow through the transistor 41 and thus also through the resistor 43 changes. This in turn influences the voltage present on the second amplifier input 61.

The current flowing in the line section 23 is also influenced due to the current flowing through the transistor 41 and the resistor 43.

In this way, it is possible to impress a current curve which, as the signal curve, carries the data to be transmitted to the receiving device 17 on the line section 23, wherein, due to the digital controller 33 configured for this purpose, pulses of the signal curve have a favorable shape in terms of a reduced harmonic component and a minimized electromagnetic radiation, particularly preferably one of the pulse shapes shown in FIGS. 2 to 4.

On the whole, it is thus evident that it is possible, by means of the method and the circuit configuration, to reduce the electromagnetic radiation in operation during the data transmission, in particular of a peripheral sensor for an occupant protection system of a motor vehicle with a current interface.

What is claimed is:

1. A method for generating a pulse, comprising:
   defining a predetermined first limit curve and a predetermined second limit curve for a pulse shape of the pulse, wherein the limit curves describe a change over time of a current variable and wherein the predetermined second limit curve runs entirely within the predetermined first limit curve; and
   generating, as the pulse shape for the pulse, a curve plotted between the limit curves, which, in comparison with a rectangular pulse plotted between the limit curves, in a first area of the current variable facing away from an extremum, is deformed toward the first limit curve and, in a second area of the current variable facing toward the extremum, is deformed toward the second limit curve.

2. The method according to claim 1, further comprising: generating the pulse shape with the flattest possible edges within the limit curves.

3. The method according claim 1, further comprising:
   generating an essentially rectangular pulse with rounded corners each defining a radius,
   wherein each radius is greater in an area of the rounded corners than in a case of a rectangular pulse.

4. The method according to claim 1, further comprising:
   generating a step shape with a predetermined number of steps in an area of edges of the pulse.

5. The method according to claim 1, further comprising:
   producing a curve which has a non-zero curvature everywhere except at most for an area of an extremal value as a pulse shape.

6. The method according to claim 1, further comprising:
   producing a current curve.

7. A circuit configuration for an electronic device for generating a pulse for a data transmission between the electronic device and a receiving device, comprising:
   a line section configured to carry a supply voltage and electrically connected to a data generation device, the line section simultaneously being provided for the data transmission; and
   a pulse shape generation device operatively connected to the data generation device so that data are transmittable from the data generation device to the pulse shape generation device, wherein the pulse shape generation device is operatively connected to the line section and is configured to impress a pulse shape on the line section, wherein a predetermined first limit curve and a predetermined second limit curve are defined for the pulse shape, wherein the limit curves describe a change over time of a current variable, and wherein the predetermined second limit curve runs entirely within the predetermined first limit curve, wherein the pulse shape generation device is configured to generate a pulse shape which is plotted between the limit curves, and, in comparison with a rectangular pulse plotted between the limit curves, in a first area of the current variable facing away from an extremum, the pulse shape is deformed toward the first limit curve, and, in a second area of the current variable facing toward the extremum, the pulse shape is deformed toward the second curve.

8. The circuit configuration according to claim 7, wherein the pulse shape generation device is configured to generate step-shaped pulse edges with a predetermined resolution.

9. The circuit configuration according to claim 7, further comprising:
   a current sink to which the pulse shape generation device operatively connected is electrically connected to the line section in parallel with the data generation device,
   wherein the pulse shape generation device includes a digital controller operatively connected to the data generation device and a digital/analog converter operatively connected to the digital controller, and
   wherein the digital/analog converter is configured to influence a current in the current sink depending on the digital controller.

10. The circuit configuration according to claim 7, further comprising:
    a serial arrangement including a transistor and a resistor electrically connected to the line section in parallel with the data generation device, the transistor having a control connection, a first transistor connection, and a second transistor connection, the resistor being electrically connected on a first end to the second transistor connection and on a second end to ground; and an amplifier having a first amplifier input, a second amplifier input, and an amplifier output, the amplifier output being electrically connected to the control connection of the transistor, the second amplifier input being electrically connected to the first end of the resistor, and the first amplifier input being electrically connected to a reference voltage source, wherein the pulse shape generation device is operatively connected to the reference voltage source and includes a digital controller operatively connected to the data generation device and a digital/analog converter operatively connected to the digital controller and configured to influence a voltage of the reference voltage source depending on the digital controller.

* * * * *